(12) United States Patent
Wang

(10) Patent No.: US 11,432,441 B2
(45) Date of Patent: Aug. 30, 2022

(54) DISPLAY PANEL AND DISPLAY APPARATUS

(71) Applicants: HKC CORPORATION LIMITED, Shenzhen (CN); CHONGQING HKC OPTOELECTRONICS TECHNOLOGY CO., LTD., Chongqing (CN)

(72) Inventor: Mingliang Wang, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 786 days.

(21) Appl. No.: 16/327,315

(22) PCT Filed: Nov. 1, 2018

(86) PCT No.: PCT/CN2018/113320
§ 371 (c)(1),
(2) Date: Feb. 21, 2019

(87) PCT Pub. No.: WO2020/042335
PCT Pub. Date: Mar. 5, 2020

(65) Prior Publication Data
US 2021/0360836 A1 Nov. 18, 2021

(30) Foreign Application Priority Data
Aug. 29, 2018 (CN) .......................... 201821399095.9

(51) Int. Cl.
*H05K 7/20* (2006.01)
*G06F 1/20* (2006.01)

(52) U.S. Cl.
CPC ............ *H05K 7/20963* (2013.01); *G06F 1/20* (2013.01)

(58) Field of Classification Search
CPC ..... H05K 7/20963; H05K 2201/10128; H05K 5/0017; G06F 1/20; G06F 1/1601; G06F 1/1652; G06F 1/183
See application file for complete search history.

(56) References Cited

U.S. PATENT DOCUMENTS

| 4,602,314 A | * | 7/1986 | Broadbent | ......... H05K 7/20454 257/713 |
| 5,904,497 A | * | 5/1999 | Akram | ................ H01L 23/3121 257/E23.125 |

(Continued)

FOREIGN PATENT DOCUMENTS

| CN | 1630073 A | 6/2005 |
| CN | 106842659 A | 6/2017 |

(Continued)

OTHER PUBLICATIONS

Choi Sung Hoon, Liquid Crystal Display Device, Jul. 1, 2009, PE2E English translation, KR-20090070944 (Year: 2009).*

(Continued)

*Primary Examiner* — Michael A Matey

(57) ABSTRACT

The present application discloses a display module (20) and a display apparatus (10). The display panel (10) includes a heat dissipation structure (70) for dissipating heat of a source driver (60). The heat dissipation structure (70) is adhered to an upper surface (61) of the source driver (60) far away from the printed circuit board (50), and at least one side or top corner of the upper surface (61) is not adhered with the heat dissipation structure.

20 Claims, 5 Drawing Sheets

(56) References Cited

U.S. PATENT DOCUMENTS

| | | | | |
|---|---|---|---|---|
| 6,275,220 | B1* | 8/2001 | Nitta | H05K 7/20963 345/204 |
| 6,597,113 | B1* | 7/2003 | Nitta | H05K 7/20963 345/205 |
| 6,747,350 | B1* | 6/2004 | Lin | H01L 23/552 257/E23.114 |
| 8,362,607 | B2* | 1/2013 | Scheid | H01L 23/3675 257/706 |
| 9,653,376 | B1* | 5/2017 | Hsieh | H01L 23/3675 |
| 2005/0083646 | A1* | 4/2005 | Bae | G06F 1/20 361/679.21 |
| 2005/0088071 | A1* | 4/2005 | Ahn | H05K 7/20963 313/46 |
| 2006/0231944 | A1* | 10/2006 | Huang | H01L 21/4878 257/E23.092 |
| 2006/0284914 | A1* | 12/2006 | Murakami | B41J 2/175 347/17 |
| 2007/0181908 | A1* | 8/2007 | Otremba | H01L 24/49 257/107 |
| 2008/0266507 | A1* | 10/2008 | Makishima | G02F 1/13452 349/151 |
| 2009/0135566 | A1* | 5/2009 | Choi | H05K 7/20963 361/720 |
| 2011/0101513 | A1* | 5/2011 | Kim | H01L 23/4985 257/E23.101 |
| 2011/0170017 | A1* | 7/2011 | Liu | G02F 1/13452 348/739 |
| 2012/0273928 | A1* | 11/2012 | Kim | H01L 23/4985 257/668 |
| 2014/0029216 | A1* | 1/2014 | Ukita | H05K 3/3436 361/752 |
| 2014/0217426 | A1* | 8/2014 | Inokuchi | H01L 23/50 257/88 |
| 2015/0316810 | A1* | 11/2015 | Shibahara | G02F 1/133382 349/150 |
| 2016/0105949 | A1* | 4/2016 | Fu | H01L 23/36 361/707 |
| 2016/0233148 | A1* | 8/2016 | Lu | H01L 23/3121 |
| 2018/0158750 | A1* | 6/2018 | Kim | H01L 23/36 |
| 2018/0178493 | A1* | 6/2018 | Fujioka | B32B 15/09 |
| 2020/0052231 | A1* | 2/2020 | Nakamura | G06F 1/1656 |
| 2020/0196492 | A1* | 6/2020 | Kim | H05K 1/147 |
| 2021/0044684 | A1* | 2/2021 | Baek | H04M 1/0274 |
| 2022/0046784 | A1* | 2/2022 | Kim | H05K 1/147 |

FOREIGN PATENT DOCUMENTS

| | | | |
|---|---|---|---|
| CN | 106898587 | A | 6/2017 |
| JP | 2010102219 | A | 5/2010 |
| KR | 20070056499 | A * | 6/2007 |
| KR | 20080052716 | A | 6/2008 |
| KR | 20100072656 | * | 7/2010 |
| KR | 20150134143 | * | 12/2015 |
| TW | 500938 | B1 * | 9/2015 ......... G01R 19/2513 |

OTHER PUBLICATIONS

Guobin Li, the International Searching Authority written comments, May 2019, CN.

* cited by examiner

DISPLAY PANEL AND DISPLAY APPARATUS

The present application claims priority to the Chinese Patent Application No. CN201821399095.9, filed to the Chinese Patent Office on Aug. 29, 2018, and entitled "DISPLAY PANEL AND DISPLAY APPARATUS", which is incorporated herein by reference in its entirety.

TECHNICAL FIELD

The present application relates to the technical field of display, and more particularly, to a display panel and a display apparatus.

BACKGROUND

The description here only provides background information related to the present application, and does not necessarily constitute the existing technology.

The liquid crystal display has numerous advantages such as thin body, power saving and no radiation, and is widely applied. The liquid crystal display on the market is mostly a backlight liquid crystal display including a liquid crystal panel and a backlight module. The liquid crystal panel works by placing liquid crystal molecules in two parallel glass substrates, and applying a drive voltage to the two glass substrates to control a rotation direction of the liquid crystal molecules, to refracting the light ray from the backlight module to generate a screen.

Nowadays, with development of large size, high resolution and high-frame frequency of the television, a source driver which is a high-efficiency integrated circuit chip plays a major role. The source driver is also a high-heating element and needs assist for heat dissipation, since the source driver includes a plurality of electronic elements while the electronic elements generate heat in the operating state due to the internal resistance thereof.

The upper and lower surfaces of the source driver are adhered with a cooling aluminum foil, but uneven adhering occurs when the surfaces of the source driver is adhered with the cooling aluminum foil, so that the aluminum foil deforms and then affects the heat dissipation effect of the source driver.

SUMMARY

The present application aims to provide a display panel and apparatus to solve how to carry out heat dissipation more efficiently.

The purpose of the present application is realized through the following technical scheme:

a display panel includes:
a main board;
a printed circuit board electrically connected with the main board;
a source driver disposed on the printed circuit board; and
a heat dissipation structure for dissipating heat of the source driver;

where, the heat dissipation structure is adhered to an upper surface of the source driver far away from the printed circuit board, and at least one side or top corner of the upper surface is not adhered with the heat dissipation structure.

Optionally, a shape of the upper surface is rectangular, the upper surface includes four right-angle sides and four right angles formed by intersecting between two of the four sides; and the four right-angle sides and the four right angles are adhered or incompletely adhered with the heat dissipation structure.

Optionally, the heat dissipation structure includes a body that is adhered to the central position on the upper surface and is not adhered to the four right angles and the four right-angle sides.

Optionally, the heat dissipation structure also includes a first side and a second side that are correspondingly disposed at two sides of the body, respectively; the first and second sides are set to be adhered on the upper surface and at the right-angle sides at two sides of the source driver far away from the end of the body.

Optionally, the upper surface is set as a rectangle, the shape of the body is set as a rectangle, the long side of the body is corresponding and parallel to the long side of the upper surface, and the short side of the body is corresponding and parallel to the short sides of the upper surface and the lower surface; the long sides of the first and second sides are corresponding and parallel to the long side of the upper surface, and the short sides of the first and second sides are corresponding and parallel to the short side of the upper surface.

Optionally, the first side, the body and the second side are integrated.

Optionally, the heat dissipation structure is an aluminum foil cooling fin.

The present application also discloses a display panel including:
a main board;
a printed circuit board electrically connected with the main board;
a source driver disposed on the printed circuit board; and
a heat dissipation structure for dissipating heat of the source driver;

where, the heat dissipation structure is adhered to an upper surface of the source driver far away from the printed circuit board, and at least one side or top corner of the upper surface is not adhered with the heat dissipation structure;

the heat dissipation structure includes a body that is adhered to the central position on the upper surface and is not adhered to the four right angles and the four right-angle sides;

the heat dissipation structure also includes a first side and a second side that are correspondingly disposed at two sides of the body, respectively; the first and second sides are set to be adhered on the upper surface and at the right-angle sides at two sides of the source driver far away from the end of the body; the upper surface is set as a rectangle, the shape of the body is set as a rectangle, the long side of the body is corresponding and parallel to the long side of the upper surface, and the short side of the body is corresponding and parallel to the short sides of the upper surface and the lower surface; the long sides of the first and second sides are corresponding and parallel to the long side of the upper surface, and the short sides of the first and second sides are corresponding and parallel to the short side of the upper surface; and the first side, the body and the second side are integrated.

The present application discloses a display apparatus including a display panel; the display panel includes:
a main board;
a printed circuit board electrically connected with the main board;

a source driver disposed on the printed circuit board; and a heat dissipation structure for dissipating heat of the source driver;

where, the heat dissipation structure is adhered to an upper surface of the source driver far away from the printed circuit board, and at least one side or top corner of the upper surface is not adhered with the heat dissipation structure;

and a drive circuit to drive the display panel.

Optionally, a shape of the upper surface is rectangular, the upper surface includes four right-angle sides and four right angles formed by intersecting between two of the four sides; and the four right-angle sides and the four right angles are not adhered with the heat dissipation structure.

Optionally, a shape of the upper surface is rectangular, the upper surface includes four right-angle sides and four right angles formed by intersecting between two of the four sides; and the four right-angle sides and the four right angles are adhered or incompletely adhered with the heat dissipation structure.

Optionally, the heat dissipation structure includes a body that is adhered to the central position on the upper surface and is not adhered to the four right angles and the four right-angle sides.

Optionally, the heat dissipation structure also includes a first side and a second side that are correspondingly disposed at two sides of the body, respectively; the first and second sides are set to be adhered on the upper surface and at the right-angle sides at two sides of the source driver far away from the end of the body.

Optionally, the upper surface is set as a rectangle, the shape of the body is set as a rectangle, the long side of the body is corresponding and parallel to the long side of the upper surface, and the short side of the body is corresponding and parallel to the short sides of the upper surface and the lower surface; the long sides of the first and second sides are corresponding and parallel to the long side of the upper surface, and the short sides of the first and second sides are corresponding and parallel to the short side of the upper surface.

Optionally, the first side, the body and the second side are integrated.

Optionally, the heat dissipation structure is an aluminum foil cooling fin. In general, the current manufacturer adheres a cooling fin on the upper surface of the source driver for heat dissipation. Because of a certain thickness of the source driver, the cooling fin will bend at the corners of the source driver after adhering the cooling fin, and then uneven adhering will occur to the cooling fin, so that the surface of the cooling fin is uneven after adhering and the heat dissipation effect of the aluminum foil is affected. In this scheme, the heat dissipation structure is adhered to an upper surface of the source driver far away from the printed circuit board, and at least one side or top corner of the upper surface is not adhered with the heat dissipation structure. In this way, it guarantees that the heat dissipation structure is adhered on the upper surface instead of the right-angle side of the source driver, therefore avoiding uneven adhering occurred to the heat dissipation structure. A flat surface after adhering can be maintained efficiently, and moreover, the heat dissipation structure can be in good fit with the source driver to efficiently conduct the heat generated during work of the data chip and guarantee stable work of the data chip.

DETAILED DESCRIPTION

Figure 1:
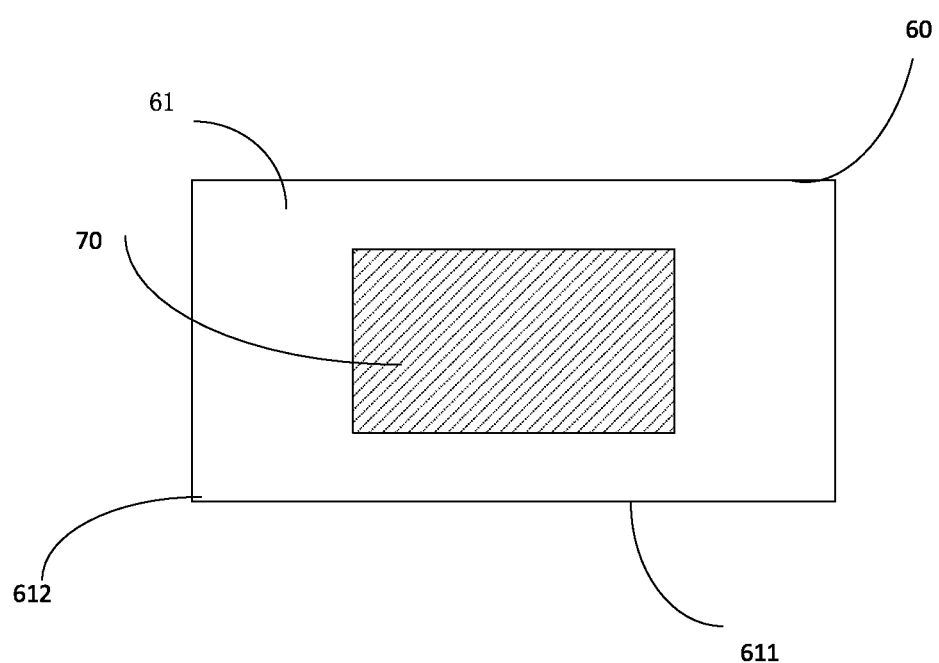
FIG. 1 is a schematic diagram of a heat dissipation structure being adhered on a source driver of an embodiment in the present application.

It should be noted that the terms used herein are merely for the purpose of describing the specific embodiments, and are not intended to limit the exemplary embodiments.

For instance, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. The specific meanings about the foregoing terms in the present application may be understood by those skilled in the art according to specific circumstances; the terms such as "first" and "second" are merely for a descriptive purpose, and cannot be understood as indicating or implying a relative importance, or implicitly indicating the number of the indicated technical features. Hence, the features defined by "first" and "second" can explicitly or implicitly include one or more features. In the description of the present application, the singular forms "a", "an" are intended to include the plural forms as well; and "a plurality of" means two or more, unless otherwise stated. The terms "comprise" and/or "include" used herein specify the presence of the stated features, integers, steps, operations, elements and/or components, but do not preclude the presence or addition of one or more other features, integers, steps, operations, elements, components and/or combinations thereof.

The present application is illustrated below in detail in conjunction with the drawings and optional embodiments.

It is now popular that the upper and lower surfaces of the source driver 60 are adhered with a cooling aluminum foil, but uneven adhering occurs when the surfaces of the source driver 60 is adhered with the cooling aluminum foil, so that the aluminum foil deforms and then affects the heat dissipation effect of the source driver 60.

A display panel 20 and a display apparatus 10 of an embodiment in the present application are described below referring to FIGS. 1 to 5.

Referring to FIG. 1, the display panel 20 includes:

a main board 40;

a printed circuit board 50 electrically connected with the main board 40;

a source driver 60 disposed on the printed circuit board 50; and a heat dissipation structure 70 for dissipating heat of the source driver 60;

where, the heat dissipation structure 70 is adhered to an upper surface of the source driver 60 far away from the printed circuit board 50, and at least one side or top corner of the upper surface 61 is not adhered with the heat dissipation structure 70.

In general, the manufacturer adheres a cooling fin on the upper surface 61 of the source driver 60 for heat dissipation. Because of a certain thickness of the source driver 60, the cooling fin will bend at the corners of the source driver 60 after adhering the cooling fin, and then uneven adhering will occur to the cooling fin, so that the surface of the cooling fin is uneven after adhering and the heat dissipation effect of the aluminum foil is affected. In this scheme, the heat dissipation structure 70 is adhered to an upper surface 61 of the source driver 60 far away from the printed circuit board 50, and at least one side or top corner of the upper surface 61 is not adhered with the heat dissipation structure 70. In this way, it guarantees that the heat dissipation structure 70 is adhered on the upper surface 61 instead of the right-angle 612 side 611 of the source driver 60, therefore avoiding uneven adhering occurred to the heat dissipation structure 70. A flat surface after adhering can be maintained efficiently, and moreover, the heat dissipation structure 70 can be in good fit with the source driver 60 to efficiently conduct the heat generated during work of the data chip and guarantee stable work of the data chip.

Figure 2:
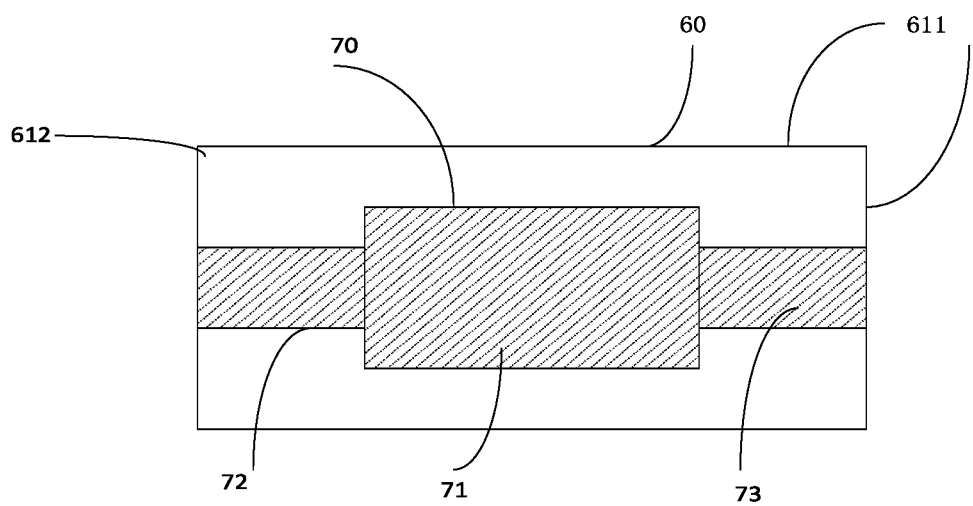
FIG. 2 is a schematic diagram of the heat dissipation structure being adhered on the source driver of an embodiment in the present application.
Figure 3:
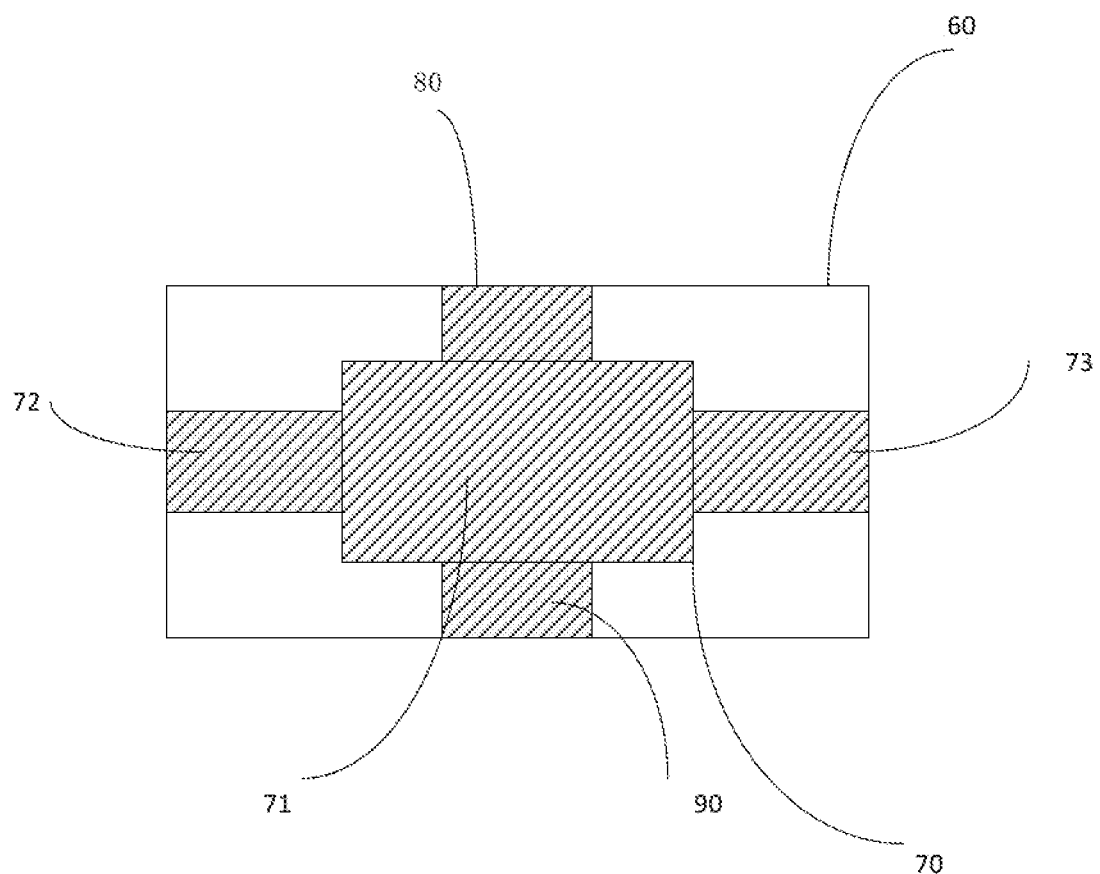
FIG. 3 is a schematic diagram of the heat dissipation structure being adhered on the source driver of another embodiment in the present application.

As another embodiment of the present application, referring to FIGS. 2 and 3, a shape of the upper surface 61 is rectangular, the upper surface 61 includes four right-angle 612 sides 611 and four right angles 612 formed by intersecting between two of the four sides; and the four right-angle 612 sides 611 and the four right angles 612 are not adhered with the heat dissipation structure 70; the heat dissipation structure 70 includes a body 71 that is adhered to the central position on the upper surface 61 and is not adhered to the four right angles 612 and the four right-angle 612 sides 611; the heat dissipation structure 70 also includes a first side 72 and a second side 73 that are correspondingly disposed at two sides of the body 71, respectively; the first side 72 and the second side 73 are set to be adhered on the upper surface 61 and at the right-angle 612 sides 611 at two sides of the source driver 60 far away from the end of the body 71; the upper surface 61 is set as a rectangle, the shape of the body 71 is set as a rectangle, the long side of the body 71 is corresponding and parallel to the long side of the upper surface 61, and the short side of the body 71 is corresponding and parallel to the short sides of the upper surface 61 and the lower surface; the long sides of the first side 72 and the second side 73 are corresponding and parallel to the long side of the upper surface 61, and the short sides of the first side 72 and the second side 73 are corresponding and parallel to the short side of the upper surface 61.

In this scheme, the four right-angle 612 sides 611 and the four right angles 612 of the upper surface 61 of the source driver 60 are adhered or incompletely adhered with the heat dissipation structure 70. On one hand, it can guarantee that the heat dissipation structure 70 is not adhered to the position of the right angle 612 sides 611 and the right angles 612 of the data chip, avoid the heat dissipation structure 70 from bending and causing deformation of its structure, and then good connection cannot be realized at the corner of the data chip, and the heat generated during work of the source driver 60 cannot be conducted efficiently. On the other hand, the material for making the heat dissipation structure 70 can be reduced for reducing the production cost.

In this scheme, the first side 72 and the second side 73 are disposed at two sides of the body 71, to increase the contact area between the heat dissipation structure 70 and the data drive surface, and then the heat dissipation structure 70 can conduct more heat generated on the source driver 60. Meanwhile, the first side 72 and the second side 73 are adhered at the right angle 612 sides 611 at two sides of the interactive chip, and can be adhered at two sides of the drive chip without bending too much, thereby strengthening the adhering strength of the heat dissipation structure 70 and avoiding the heat dissipation structure 70 from falling off under an external force.

In this scheme, the long side and the short side of the body 71 are corresponding and parallel to the long side and the short side of the upper surface 61; the long sides and the short sides of the first side 72 and the second side 73 are corresponding and parallel to the long side and the short side of the upper surface 61, respectively, such that adhering the heat dissipation structure 70 to the upper surface 61 can be carried out according to the corresponding long and short sides of the heat dissipation structure 70 and the source driver 60; and in this way, the function of indicating the adhering direction can be realized and it guarantees that adhering will not be carried out in a wrong direction.

Optionally, in this embodiment, a shape of the upper surface 61 is rectangular, the upper surface 61 includes four right-angle 612 sides 611 and four right angles 612 formed by intersecting between two of the four sides; and the four right-angle 612 sides 611 and the four right angles 612 are adhered or incompletely adhered with the heat dissipation structure 70.

In this scheme, the four right-angle 612 sides 611 and the four right angles 612 of the upper surface 61 of the source driver 60 are adhered or incompletely adhered with the heat dissipation structure 70. On one hand, it can guarantee that the heat dissipation structure 70 is not adhered to the position of the light angle 612 sides 611 and the right angles 612 of the data chip, avoid the heat dissipation structure 70 from bending and causing deformation of its structure, and then good connection cannot be realized at the corner of the data chip, and the heat generated during work of the source driver 60 cannot be conducted efficiently. On the other hand, the material for making the heat dissipation structure 70 can be reduced for reducing the production cost.

Optionally, in this embodiment, the first side 72, the body 71 and the second side 73 are integrated.

In this scheme, the first side 72, the body 71 and the second side 73 are integrated to increase the adhering area of the heat dissipation structure 70 and reduce the external force acting on the heat dissipation structure, so that the external force acting on a part of the unit area of the heat dissipation structure 70, particularly the body, is decreased, and the possibility that the heat dissipation structure 70, particularly the body 71, partially falls off. Moreover, compared with a way of directly connecting the first side 72 and the second side 73 and forming two layers of aluminum foils over the body 71, the thickness is decreased, and then connection misplacing, that might occur when the body 71 and the sides are formed independently while assembling and adhering, is then avoided.

Optionally, in this embodiment, the material of the heat dissipation structure 70 is aluminum foil.

Moreover, a third side 80 and a fourth side 90 that are in corresponding positions are disposed at the long side of the body 71.

In this scheme, after the body 71 is provided with the third side 80 and the fourth side 90, the contact area between the heat dissipation structure 70 and source driver 60 is increased, the area of the heat dissipation structure 70 capable of conducting heat is increased, and then the heat dissipation efficiency of the heat dissipation structure 70 is improved. Moreover, after adhering the heat dissipation structure 70, the third side 80 and the fourth side 90 can support two sides of the body 71 to prevent the body 71 from easily falling off under the external force.

In this scheme, aluminum foil is a high-efficiency heat conduction material, and is an ideal material for dissipating heat for an electronic element due to its strong plasticity.

As another embodiment of the present application, referring to FIG. 2, the difference between FIG. 2 and the above embodiment lies in:

a display panel 20 includes:

a main board 40;

a printed circuit board 50 electrically connected with the main board 40:

a source driver 60 disposed on the printed circuit board 50; and a heat dissipation structure 70 for dissipating heat of the source driver 60;

where, the heat dissipation structure 70 is adhered to an upper surface of the source driver 60 far away from the printed circuit board 50, and at least one side or top corner of the upper surface 61 is not adhered with the heat dissipation structure 70;

the heat dissipation structure 70, which is an aluminum foil cooling fin, includes a body 71 that is adhered to the central position on the upper surface 61 and is not adhered to the four right angles 612 and the four right-angle 612 sides 611;

the heat dissipation structure 70 includes a body 71 that is adhered to the central position on the upper surface 61 and is not adhered to the four right angles 612 and the four right-angle 612 sides 611; the heat dissipation structure 70 also includes a first side 72 and a second side 73 that are correspondingly disposed at two sides of the body 71, respectively; the first side 72 and the second side 73 are set to be adhered on the upper surface 61 and at the right-angle 612 sides 611 at two sides of the source driver 60 far away from the end of the body 71; the upper surface 61 is set as a rectangle, the shape of the body 71 is set as a rectangle, the long side of the body 71 is corresponding and parallel to the long side of the upper surface 61, and the short side of the body 71 is corresponding and parallel to the short sides of the upper surface 61 and the lower surface; the long sides of the first side 72 and the second side 73 are corresponding and parallel to the long side of the upper surface 61, and the short sides of the first side 72 and the second side 73 are corresponding and parallel to the short side of the upper surface 61; and the first side 72, the body 71 and the second side 73 are integrated.

In this scheme, the heat dissipation structure 70 is an aluminum foil cooling fin; aluminum foil is a high-efficiency heat conduction material, and is an ideal material for dissipating heat for an electronic element; the aluminum foil cooling fin includes a first side 72, a body 71 and a second side 73; the body 71 is adhered to the central position on the upper surface 61 of the source driver 60 and is not adhered to the four right angles 612 and the four right-angle 612 sides 611; and the central position of the source driver 60 is the major heat generation position where the high-efficiency conduction source driver 60 is adhered. Moreover, the body 71 is adhered to the rear surface evenly without bending, which causes the aluminum foil cooling fin to deform and finally affects fitness between the aluminum foil cooling fin and the source driver 60; heat cannot be conducted efficiently, so that the source driver 60 cannot work stably due to high temperature; the long side and the short side of the body 71 are corresponding and parallel to the long side and the short side of the upper surface 61; the long sides and the short sides of the first side 72 and the second side 73 are corresponding and parallel to the long side and the short side of the upper surface 61, respectively, such that adhering the heat dissipation structure 70 to the upper surface 61 can be carried out according to the corresponding long and short sides of the heat dissipation structure 70 and the source driver 60; in this way, the function of indicating the adhering direction can be realized and it guarantees that adhering will not be carried out in a wrong direction. The first side 72, the body 71 and the second side 73 are integrated to increase the adhering area of the heat dissipation structure 70 and reduce the external force acting on the heat dissipation structure, so that the external force acting on a part of the unit area of the heat dissipation structure 70, particularly the body, is decreased, and the possibility that the heat dissipation structure 70, particularly the body 71, partially falls off. Moreover, compared with a way of directly connecting the first side 72 and the second side 73 and forming two layers of aluminum foils over the body 71, the thickness is decreased, and then connection misplacing, that might occur when the body 71 and the sides are formed independently while assembling and adhering, is also avoided.

Figure 4:
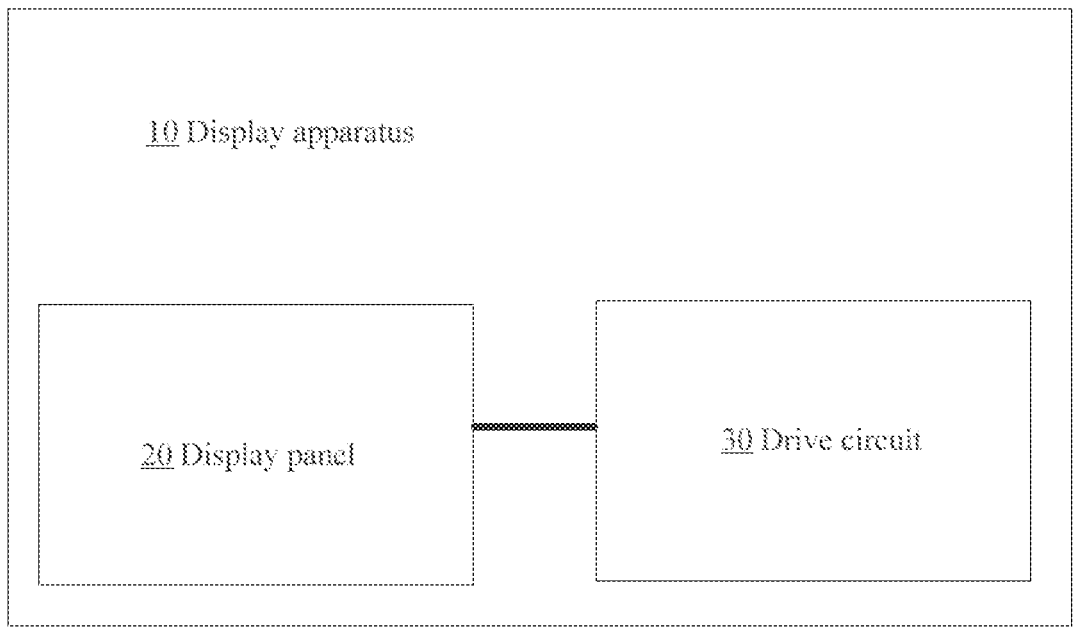
FIG. 4 is a structural schematic diagram of a display apparatus of an embodiment in the present application.
Figure 5:
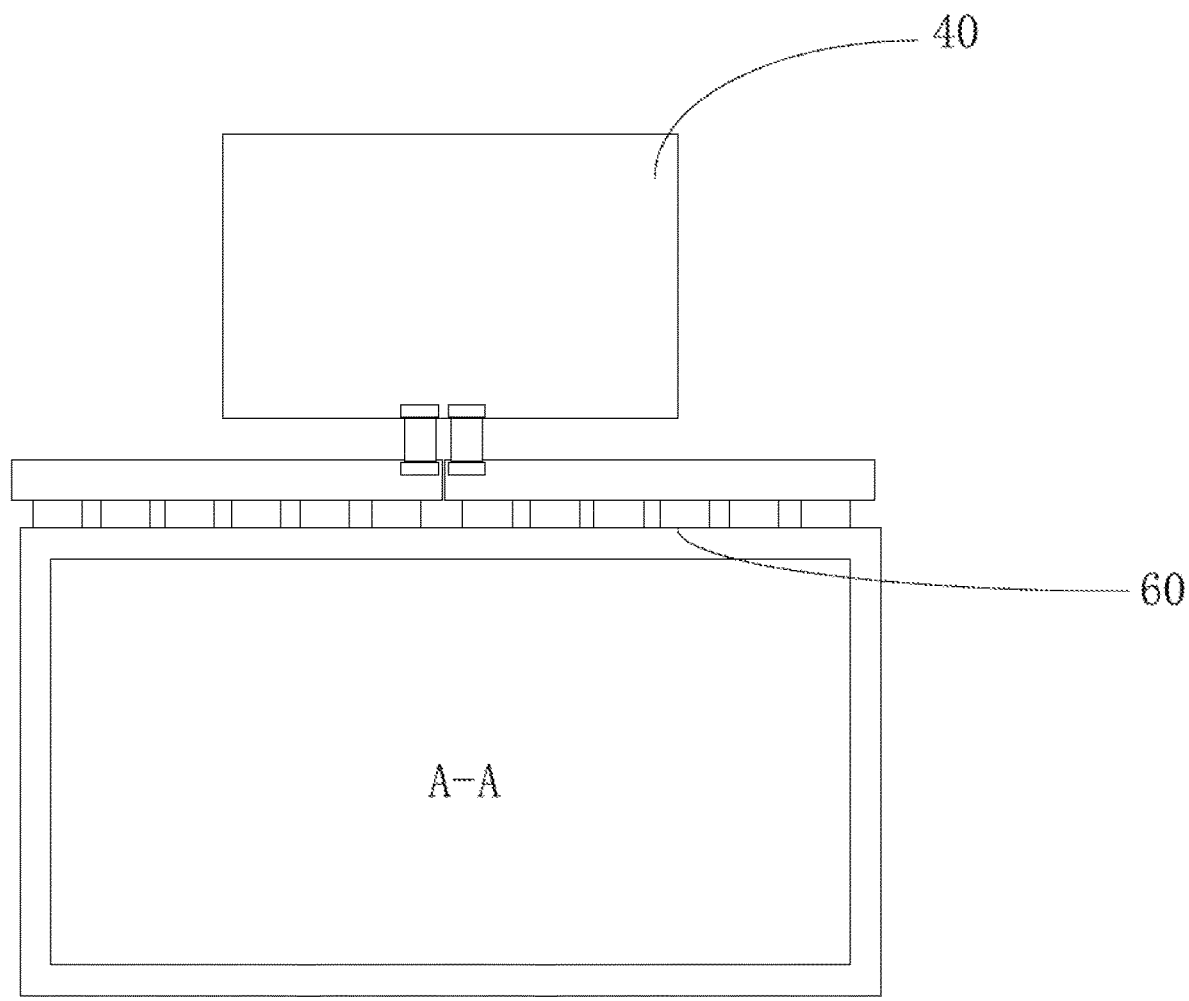
FIG. 5 is a structural schematic diagram of an exemplary display panel of an embodiment in the present application.

As another embodiment of the present application, referring to FIGS. 2 and 4, the difference from the above embodiment lies in:

a display apparatus 10 includes a display panel 20; the display panel 20 includes:

a main board 40;

a printed circuit board 50 electrically connected with the main board 40;

a source driver 60 disposed on the printed circuit board 50; and a heat dissipation structure 70 for dissipating heat of the source driver 60;

where, the heat dissipation structure 70 is adhered to an upper surface of the source driver 60 far away from the printed circuit board 50, and at least one side or top corner of the upper surface 61 is not adhered with the heat dissipation structure 70; and a drive circuit 30 to drive the display panel 20.

In general, the manufacturer adheres a cooling fin on the upper surface 61 of the source driver 60 for heat dissipation. Because of a certain thickness of the source driver 60, the cooling fin will bend at the corners of the source driver 60 after adhering the cooling fin, and then uneven adhering will occur to the cooling fin, so that the surface of the cooling fin is uneven after adhering and the heat dissipation effect of the aluminum foil is affected. In this scheme, the heat dissipation structure 70 is adhered to an upper surface 61 of the source driver 60 far away from the printed circuit board 50, and at least one side or top corner of the upper surface 61 is not adhered with the heat dissipation structure 70. In this way, it guarantees that the heat dissipation structure 70 is adhered on the upper surface 61 instead of the right-angle 612 side 611 of the source driver 60, therefore avoiding uneven adhering occurred to the heat dissipation structure 70. A flat surface after adhering can be maintained efficiently, and moreover, the heat dissipation structure 70 can be in good fit with the source driver 60 to efficiently conduct the heat generated during work of the data chip and guarantee stable work of the data chip.

The technical scheme of the present application can be widely applied to various display panels, e.g., a TN type display panel (all referred to as Twisted Nematic, i.e., twisted nematic panel), an IPS type display panel (In-plane switching), a VA type display panel (Multi-domain Vertical Alignment, Multi-domain Vertical Alignment technology), and can certainly be display panels of other types, e.g., an organic light-emitting display panel (organic light-emitting diode, for short OLED display panel), which can be applied to the above-mentioned scheme.

The above contents are detailed descriptions for the present application in conjunction with the specific optional implementation, and it cannot be affirmed that the specific implementation of the present application is only limited to these descriptions. For those skilled in the art of the present application, several simple deductions or replacements can be made without departing from the idea of the present application and should be deemed as belonging to the scope of protection of the present application.

What is claimed is:

1. A display panel, comprising:
a main board;
a printed circuit board electrically connected with the main board;
a source driver disposed on the printed circuit board; and
a heat dissipation structure for dissipating heat of the source driver;
wherein the heat dissipation structure is adhered to an upper surface of the source driver far away from the printed circuit board, and at least one side or top corner of the upper surface of the source driver is not adhered with the heat dissipation structure, wherein the at least one side or top corner of the upper surface of the source driver is spaced apart from a corresponding edge of the heat dissipation structure.

2. The display panel according to claim 1, wherein a shape of the upper surface of the source driver is rectangular, the upper surface comprises four right-angle sides and four right angles formed by every two adjacent intersecting sides of the four right-angle sides; and wherein the four right-angle sides and the four right angles are not adhered with and are spaced apart from the heat dissipation structure.

3. The display panel according to claim 1, wherein a shape of the upper surface of the source driver is rectangular, the upper surface comprises four right-angle sides and four right angles formed by every two adjacent intersecting sides of the four right-angle sides; and wherein the four right-angle sides and the four right angles are adhered but are not totally adhered with the heat dissipation structure.

4. The display panel according to claim 1, wherein the upper surface of the source driver has a rectangular shape that comprises four right-angle sides and four right angles formed by every two adjacent intersecting sides of the four right-angle sides, and wherein the heat dissipation structure comprises a body that is adhered to a central position on the upper surface of the source driver and is not adhered to and is spaced apart from the four right angles and the four right-angle sides of the rectangular-shaped upper surface of the source driver.

5. The display panel according to claim 4, wherein the heat dissipation structure further comprises a first side portion and a second side portion that are correspondingly disposed at two sides of the body of the heat dissipation structure, respectively; wherein the first side portion and the second side portion are adhered with the upper surface of the source driver, and wherein two outer ends of the first side portion and the second side portion that are far away from the body are adhered with two corresponding sides of the upper surface of the source driver.

6. The display panel according to claim 5, wherein a long side of the body of the heat dissipation structure is corresponding and parallel to a long side of the upper surface of the source driver, and a short side of the body of the heat dissipation structure is corresponding and parallel to a short side of the upper surface of the source driver; wherein long sides of the first and second side portions are corresponding and parallel to the long side of the upper surface of the source driver, and short sides of the first and second side portions are corresponding and parallel to the short side of the upper surface of the source driver.

7. The display panel according to claim 5, wherein the first side portion, the body and the second side portion are integrally formed.

8. The display panel according to claim 1, wherein the heat dissipation structure is an aluminum foil cooling fin.

9. The display panel according to claim 6, wherein the body of the heat dissipation structure is rectangular-shaped, wherein the first side portion and the second side portion are identical and rectangular-shaped, wherein a side of the first side portion is joined with a middle portion of a corresponding side of the rectangular-shaped body of the heat dissipation structure, and the side of the first side portion is shorter than the corresponding side of the rectangular-shaped body of the heat dissipation structure; wherein a side of the second side portion is joined with a middle portion of another corresponding side of the rectangular-shaped body of the heat dissipation structure, and the side of the second side portion is shorter than the another corresponding side of the rectangular-shaped body of the heat dissipation structure; wherein the former corresponding side and the latter another corresponding side of the rectangular-shaped body of the heat dissipation structure are two opposite parallel sides of the rectangular-shaped body of the heat dissipation structure.

10. The display panel according to claim 5, wherein the heat dissipation structure further comprises a third side portion and a fourth side portion that are correspondingly disposed at two other sides of the body of the heat dissipation structure, respectively; wherein the third side portion and the fourth side portion are adhered with the upper surface of the source driver, and wherein two outer ends of the third side portion and the fourth side portion that are far away from the body are adhered with two other corresponding sides of the upper surface of the source driver.

11. The display panel according to claim 10, wherein the body of the heat dissipation structure is rectangular-shaped, wherein the third side portion and the fourth side portion are identical and rectangular-shaped, wherein a side of the third side portion is joined with a middle portion of a corresponding side of the rectangular-shaped body of the heat dissipation structure, and the side of the third side portion is shorter than the corresponding side of the rectangular-shaped body of the heat dissipation structure; wherein a side of the fourth side portion is joined with a middle portion of another corresponding side of the rectangular-shaped body of the heat dissipation structure, and the side of the fourth side portion is shorter than the another corresponding side of the rectangular-shaped body of the heat dissipation structure; wherein the former corresponding side and the latter another corresponding side of the rectangular-shaped body of the heat dissipation structure are two opposite parallel sides of the rectangular-shaped body of the heat dissipation structure.

12. A display panel, comprising:
a main board;
a printed circuit board electrically connected with the main board;
a source driver disposed on the printed circuit board; and a heat dissipation structure for dissipating heat of the source driver;

wherein the heat dissipation structure is adhered to an upper surface of the source driver far away from the printed circuit board, and at least one side or top corner of the upper surface is not adhered with the heat dissipation structure, wherein the at least one side or top corner of the upper surface of the source driver is spaced apart from a corresponding edge of the heat dissipation structure;

wherein the upper surface of the source driver has a rectangular shape that comprises four right-angle sides and four right angles formed by every two adjacent intersecting sides of the four right-angle sides, and wherein the heat dissipation structure comprises a body that is adhered to a central position on the upper surface of the source driver and is not adhered to and is spaced apart from the four right angles and the four right-angle sides of the rectangular-shaped upper surface of the source driver;

the heat dissipation structure further comprises a first side portion and a second side portion that are correspondingly disposed at two sides of the body, respectively; the first and second side portions are adhered with the upper surface of the source driver, and wherein two outer ends of the first side portion and the second side portion that are far away from the body are adhered with two corresponding sides of the upper surface of the source driver, wherein a long side of the body of the heat dissipation structure is corresponding and parallel to a long side of the upper surface of the source driver, and a short side of the body is corresponding and parallel to a short side of the upper surface of the source driver; wherein long sides of the first and second side portions are corresponding and parallel to the long side of the upper surface of the source driver, and short sides of the first and second side portions are corresponding and parallel to the short side of the upper surface of the source driver; and the first side portion, the body, and the second side portion are integrally formed.

13. A display apparatus, comprising a display panel, the display panel comprising:
a main board;
a printed circuit board electrically connected with the main board;
a source driver disposed on the printed circuit board; and
a heat dissipation structure for dissipating heat of the source driver;
wherein the heat dissipation structure is adhered to an upper surface of the source driver far away from the printed circuit board, and at least one side or top corner of the upper surface is not adhered with the heat dissipation structure, wherein the at least one side or top corner of the upper surface of the source driver is spaced apart from a corresponding edge of the heat dissipation structure;
and a drive circuit to drive the display panel.

14. The display apparatus according to claim 13, wherein a shape of the upper surface of the source driver is rectangular, the upper surface comprises four right-angle sides and four right angles formed by every two adjacent intersecting sides of the four right-angle sides; and wherein the four right-angle sides and the four right angles are not adhered with and are spaced apart from the heat dissipation structure.

15. The display apparatus according to claim 10, wherein a shape of the upper surface of the source driver is rectangular, the upper surface comprises four right-angle sides and four right angles formed by every two adjacent intersecting sides of the four right-angle sides; and wherein the four right-angle sides and the four right angles are adhered but are not totally adhered with the heat dissipation structure.

16. The display apparatus according to claim 13, wherein the upper surface of the source driver has a rectangular shape that comprises four right-angle sides and four right angles formed by every two adjacent intersecting sides of the four right-angle sides, and wherein the heat dissipation structure comprises a body that is adhered to a central position on the upper surface of the source driver and is not adhered to and is spaced apart from the four right angles and the four right-angle sides of the rectangular-shaped upper surface of the source driver.

17. The display apparatus according to claim 16, wherein the heat dissipation structure further comprises a first side portion and a second side portion that are correspondingly disposed at two sides of the body, respectively; wherein the first side portion and the second side portion adhered with the upper surface of the source driver, and wherein two outer ends of the first side portion and the second side portion that are far away from the body are adhered with two corresponding sides of the upper surface of the source driver.

18. The display apparatus according to claim 17, wherein a long side of the body is corresponding and parallel to a long side of the upper surface of the source driver, and a short side of the body is corresponding and parallel to a short tides side of the upper surface of the source driver; wherein long sides of the first and second side portions are corresponding and parallel to the long side of the upper surface of the source driver, and short sides of the first and second side portions are corresponding and parallel to the short side of the upper surface of the source driver.

19. The display apparatus according to claim 17, wherein, the first first side portion, the body, and the second side portion are integrally formed.

20. The display apparatus according to claim 13, wherein the heat dissipation structure is an aluminum foil cooling fin.

* * * * *